US012713647B2

(12) United States Patent
Motai et al.

(10) Patent No.: US 12,713,647 B2
(45) Date of Patent: Aug. 18, 2026

(54) SEMICONDUCTOR DEVICE WITH DIFFUSION LAYERS IN TERMINATION REGION AND MANUFACTURING METHOD THEREOF

(71) Applicants: Kabushiki Kaisha Toshiba, Tokyo (JP); Toshiba Electronic Devices & Storage Corporation, Tokyo (JP)

(72) Inventors: Takako Motai, Yokohama Kanagawa (JP); Yoko Iwakaji, Meguro Tokyo (JP); Kaori Fuse, Yokohama Kanagawa (JP); Keiko Kawamura, Yokohama Kanagawa (JP); Kentaro Ichinoseki, Higashimurayama Tokyo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 632 days.

(21) Appl. No.: 18/113,445

(22) Filed: Feb. 23, 2023

(65) Prior Publication Data

US 2024/0097021 A1 Mar. 21, 2024

(30) Foreign Application Priority Data

Sep. 21, 2022 (JP) ................................ 2022-150357

(51) Int. Cl.
*H10D 30/66* (2025.01)
*H10D 30/01* (2025.01)

(52) U.S. Cl.
CPC ....... *H10D 30/665* (2025.01); *H10D 30/0297* (2025.01); *H10D 30/668* (2025.01)

(58) Field of Classification Search
CPC ............ H10D 30/665; H10D 30/0297; H10D 30/668; H10D 12/481; H10D 12/038; H10D 64/112; H10D 62/106; H10D 62/109

(Continued)

(56) References Cited

U.S. PATENT DOCUMENTS 7,911,020 B2 3/2011 Niimura et al.
8,994,141 B2 3/2015 Takahashi et al.

(Continued)

FOREIGN PATENT DOCUMENTS

CN 102842609 A 12/2012
CN 202839619 U 3/2013

(Continued)

OTHER PUBLICATIONS

Bose J V C et al., "Influence of a shallow p+ offset region on a novel edge termination technique using lightly doped p-rings", Semiconductor Conference, vol. 1, Oct. 5, 1999 (Oct. 5, 1999), pp. 63-66.

(Continued)

*Primary Examiner* — Mohammad M Hoque
(74) *Attorney, Agent, or Firm* — Kim & Stewart LLP

(57) ABSTRACT

A semiconductor device includes a semiconductor substrate, a cell region provided, and a termination region. The termination region surrounds the cell region and includes a plurality of first diffusion layers containing a first conductive impurity, a plurality of second diffusion layers each disposed on an outer side of each of the plurality of first diffusion layers and having a concentration of the first conductive impurity lower than that of the first diffusion layers, and a plurality of conductive layers opposing the first diffusion layers and the second diffusion layers on the front face of the semiconductor substrate, the plurality of conductive layers electrically connected to the first diffusion layers, the plu- (Continued)

rality of conductive layers each having an outer end portion. On a lower side of the outer end portion, any one of the plurality of second diffusion layers is present.

20 Claims, 19 Drawing Sheets

(58) Field of Classification Search
USPC .......................................................... 257/330
See application file for complete search history.

(56) References Cited

U.S. PATENT DOCUMENTS

| | | | | |
|---|---|---|---|---|
| 9,324,816 | B2 | 4/2016 | Matsudai et al. | |
| 9,653,557 | B2 | 5/2017 | Matsudai | |
| 9,911,839 | B2 | 3/2018 | Lu | |
| 10,304,948 | B2 | 5/2019 | Kato | |
| 10,964,780 | B2 | 3/2021 | Furuta et al. | |
| 11,101,345 | B2 | 8/2021 | Murasaki | |
| 12,426,301 | B2 * | 9/2025 | Yoshiura | H10D 62/105 |
| 2005/0056912 | A1 * | 3/2005 | Ninomiya | H10D 62/106 257/E29.026 |
| 2014/0299962 | A1 | 10/2014 | Takahashi | |
| 2016/0035840 | A1 * | 2/2016 | Matsudai | H10D 62/115 257/330 |
| 2017/0040441 | A1 | 2/2017 | Aoi et al. | |
| 2017/0110560 | A1 * | 4/2017 | Kato | H10D 62/393 |
| 2017/0365669 | A1 | 12/2017 | Kim | |
| 2020/0091282 | A1 * | 3/2020 | Murasaki | H10D 30/60 |
| 2020/0127086 | A1 | 4/2020 | Okawa | |
| 2022/0157951 | A1 | 5/2022 | Yilmaz et al. | |

FOREIGN PATENT DOCUMENTS

| | | | |
|---|---|---|---|
| GB | 2563110 | A | 12/2018 |
| JP | 5391447 | B2 | 1/2014 |
| JP | 5396756 | B2 | 1/2014 |
| JP | 2015-026797 | A | 2/2015 |
| JP | 2015-126193 | A | 7/2015 |
| JP | 2016-35989 | A | 3/2016 |
| JP | 2017-147393 | A | 8/2017 |
| JP | 2018-206934 | A | 12/2018 |
| JP | 2020-17673 | A | 1/2020 |
| JP | 2020-65025 | A | 4/2020 |
| WO | 2011/013379 | A1 | 2/2011 |
| WO | 2016121968 | A1 | 8/2016 |
| WO | 2018207712 | A1 | 11/2018 |

OTHER PUBLICATIONS

Japanese Office Action mailed Sep. 5, 2025 in corresponding Japanese Patent Application 2022-150357 with English Translation, 8 pages.

* cited by examiner 301
311
302
312
303
313
300
41
13
10a

SEMICONDUCTOR DEVICE WITH DIFFUSION LAYERS IN TERMINATION REGION AND MANUFACTURING METHOD THEREOF

CROSS-REFERENCE TO RELATED APPLICATIONS

This application is based upon and claims the benefit of priority from Japanese Patent Application No. 2022-150357, filed on Sep. 21, 2022; the entire contents of which are incorporated herein by reference.

FIELD

The present invention relates to a semiconductor device and a method for manufacturing the same.

BACKGROUND

In a power semiconductor device such as an IGBT (Insulated Gate Bipolar Transistor), a termination structure is known which has a plurality of guard ring layers including a plurality of p-type diffusion layers formed in a ring on a front face of a semiconductor substrate, and a field plate extending on each guard ring layer via an insulation film. Further, there are also cases in which in order to mitigate the electric field in an end portion of the guard ring layer, a RESURF layer including a p-type diffusion layer with a low concentration is formed in the end portion of the guard ring layer.

As described above, in the termination structure including the guard ring layer and the field plate, a high breakdown voltage can be exhibited by making the field plate longer to thus disperse the electric field exerted on the guard ring layer. However, since the termination region does not contribute to the function of the power semiconductor device, the field plate is preferably shorter. Meanwhile, when the field plate is made shorter, the semiconductor device becomes more susceptible to external charge. The external charge includes impurity ions within a resin that seals the power semiconductor device, externally incoming contaminants, and the like. Such external charge is accumulated in the termination region of the power semiconductor used under a high-temperature and highly-humid environment or the like, which could fluctuate the breakdown voltage of the device, thereby breaking the device in some cases. Therefore, it is important to be less susceptible to the external charge and to be highly robust against charge. Further, as the field plate is made shorter, the guard ring layer contacting the cell region is more likely to become a breakdown point. It is generally known that when a breakdown occurs in the guard ring layer formed near the cell region, the breakover voltage decreases.

DETAILED DESCRIPTION

Embodiments will now be explained with reference to the accompanying drawings. The present invention is not limited to the embodiments.

A semiconductor device according to an embodiment includes a semiconductor substrate, a cell region on a side of a front face of the semiconductor substrate, and a termination region on an outer side of the cell region on the side of the front face of the semiconductor substrate. The termination region surrounds the cell region and includes a plurality of first diffusion layers containing a first conductive impurity, a plurality of second diffusion layers each disposed on an outer side of each of the plurality of first diffusion layers and having a concentration of the first conductive impurity that is lower than that of the first diffusion layers, and a plurality of conductive layers opposing the first diffusion layers and the second diffusion layers on the front face of the semiconductor substrate, the plurality of conductive layers electrically connected to the first diffusion layers, the plurality of conductive layers each having an outer end portion. On a lower side of the outer end portion, any one of the plurality of second diffusion layers is present.

First Embodiment

Figure 1:
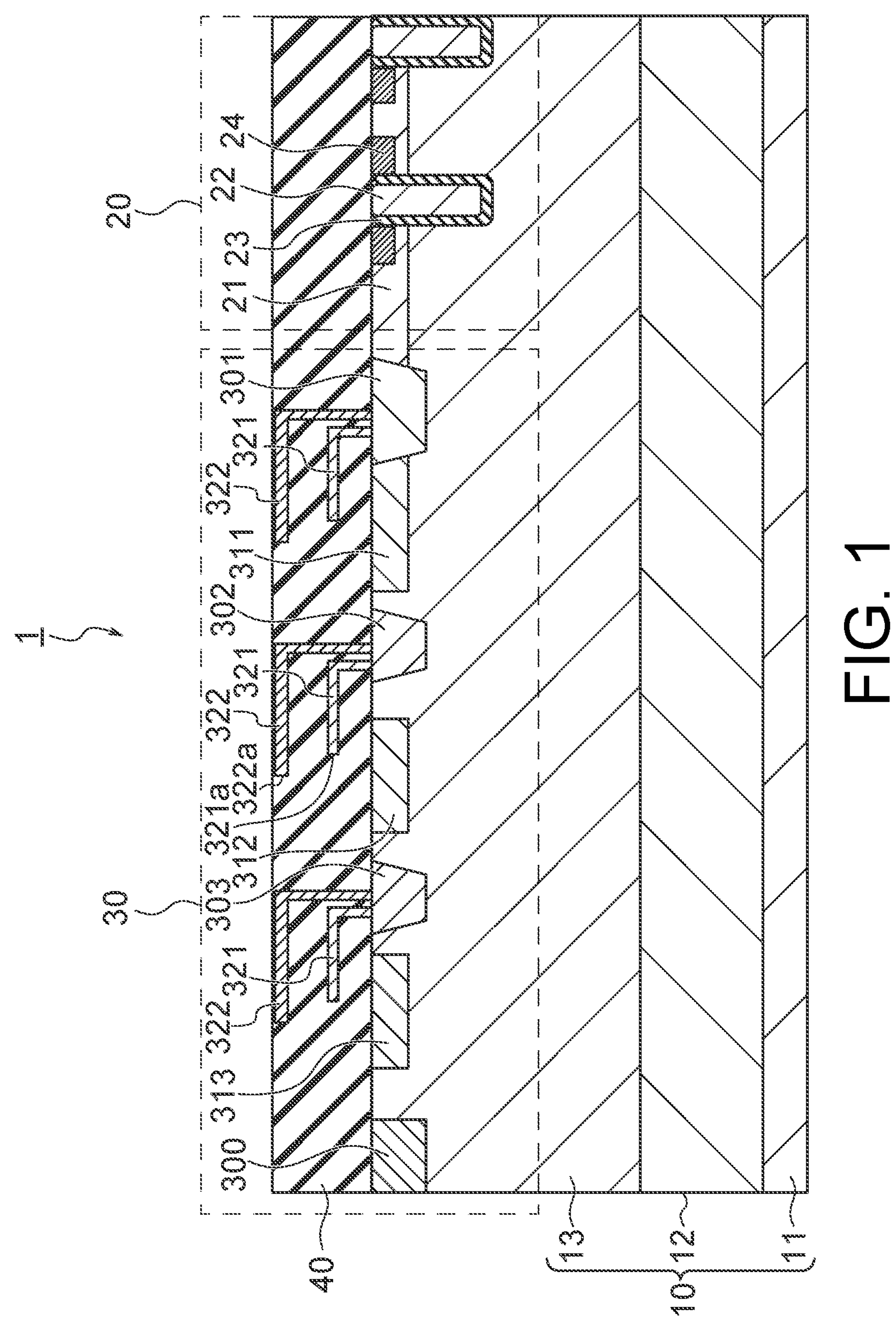
FIG. 1 is a cross-sectional view showing the schematic structure of a semiconductor device according to a first embodiment.

FIG. 1 is a cross-sectional view showing the schematic structure of a semiconductor device according to a first embodiment. A semiconductor device 1 shown in FIG. 1 is an IGBT having a trench gate structure. The semiconductor device 1 includes a cell region 20 and a termination region on a side of a front face of a semiconductor substrate 10.

Note that the semiconductor device 1 is not limited to a trench-gate IGBT, but may be a planar-gate IGBT, for example.

The semiconductor substrate 10 includes a p-type collector layer 11, an n-type buffer layer 12, and an n-type base layer 13. Hereinafter, each layer will be described.

The p-type collector layer 11 is disposed in the lowermost layer of the semiconductor substrate 10. The p-type collector layer 11 functions as an IGBT collector. The thickness of the p-type collector layer 11 is 0.2 μm, for example.

The n-type buffer layer 12 is stacked on the p-type collector layer 11. The concentration of an n-type impurity contained in the n-type buffer layer 12 is higher than the concentration of the n-type impurity contained in the n-type base layer 13. The thickness of the n-type buffer layer 12 is 1 μm, for example.

The n-type base layer 13 is stacked on the n-type buffer layer 12. The side of the front face of the n-type base layer 13 is provided with the cell region 20 and the termination region 30.

First, the cell region 20 will be described. The cell region 20 includes a p-type base layer 21, a gate electrode 22, a gate insulation film 23, and an n-type emitter layer 24.

The p-type base layer 21 corresponds to a third diffusion layer and is provided on the front face of the semiconductor substrate 10 (the n-type base layer 13). The concentration of a p-type impurity of the p-type base layer 21 is lower than the concentration of the p-type impurity of a guard ring layer of the termination region 30, which will be described later.

The gate electrode 22 extends through the p-type base layer 21 from the front face of the semiconductor substrate 10 and terminates in the n-type base layer 13. The gate electrode 22 includes polysilicon, for example.

The gate insulation film 23 electrically insulates the gate electrode 22 from the n-type base layer 13, the p-type base layer 21, and the n-type emitter layer 24. The gate insulation film 23 is a silicon dioxide ($SiO_2$) film, for example.

The n-type emitter layer 24 corresponds to a fourth diffusion layer containing an n-type impurity and opposes the gate electrode 22 via the gate insulation film 23 within the p-type base layer 21. The n-type emitter layer 24 functions as an emitter of the IGBT.

Next, the termination region 30 disposed on an outer side of the cell region 20 will be described. The termination region 30 includes an n-type EQPR (Equivalent-Potential Ring) layer 300, a first guard ring layer 301 to a third guard ring layer 303, a first RESURF layer 311 to a third RESURF layer 313, a first field plate 321, and a second field plate 322. In the termination region 30, the first guard ring layer 301 to the third guard ring layer 303 correspond to a plurality of first diffusion layers. Further, the first RESURF layer 311 to the third RESURF layer 313 correspond to a plurality of second diffusion layers. Furthermore, the first field plate 321 corresponds to a first conductive layer, and the second field plate 322 corresponds to a second conductive layer.

The EQPR layer 300 is disposed on the outermost side of the termination region 30. The concentration of an n-type impurity contained in the EQPR layer 300 is higher than the concentration of the n-type impurity contained in the n-type base layer 13. The EQPR layer 300 has the same electric potential as that of the p-type collector layer 11.

The first guard ring layer 301 to the third guard ring layer 303 are each formed of a p-type diffusion layer in a ring continuously surrounding the cell region 20. The concentration of a p-type impurity contained in each guard ring layer is higher than the concentration of the p-type impurity contained in the p-type base layer 21 of the cell region 20.

Note that in the present embodiment, three guard ring layers are provided in the termination region 30, but the number of the guard ring layers only needs to be more than one.

The first guard ring layer 301 is disposed, in the termination region 30, closest to the cell region 20. The first guard ring layer 301 contacts the p-type base layer 21 on the side of the cell region 20. Further, the first guard ring layer 301 also contacts the first RESURF layer 311 on a side of the EQPR layer 300.

The second guard ring layer 302 is disposed between the first guard ring layer 301 and the third guard ring layer 303.

The third guard ring layer 303 is disposed between the second guard ring layer 302 and the EQPR layer 300.

The first RESURF layer 311 to the third RESURF layer 313 extend on the outer side (the side of the EQPR layer 300) of their respective first guard ring layer 301 to third guard ring layer 303. The RESURF layers are each formed of the p-type diffusion layer.

The concentration of the p-type impurity of each RESURF layer is lower than the concentration of the p-type impurity of each guard ring layer. For example, the concentration of the p-type impurity of each guard ring layer is $1e^{18}$ $cm^{-3}$ and the concentration of the p-type impurity of each RESURF layer is $2.5e^{15}$ $cm^{-3}$. However, the concentration of the p-type impurity of each guard ring layer only needs to be a concentration at which no depletion occurs even when a high voltage is applied between the p-type collector layer 11 and the n-type emitter layer 24. Meanwhile, the concentration of the p-type impurity of each RESURF layer only needs to be a concentration at which depletion sufficiently occurs when the above-described high voltage is applied.

Note that in the present embodiment, each RESURF layer is thinner than each guard ring layer. That is, each RESURF layer is formed in a position shallower than each guard ring layer from the front face of the semiconductor substrate 10. However, the thickness of each RESURF layer may be the same as that of each guard ring layer or greater than that of each guard ring layer. Further, in the present embodiment, three RESURF layers are provided in the termination region 30, but the number of the RESURF layers may appropriately be set in accordance with the number of the guard ring layers.

The first RESURF layer 311 is disposed between the first guard ring layer 301 and the second guard ring layer 302. In the present embodiment, the first RESURF layer 311 contacts the first guard ring layer 301 while being spaced apart from the second guard ring layer 302. However, the first RESURF layer 311 may also contact the second guard ring layer 302.

The second RESURF layer 312 is disposed between the second guard ring layer 302 and the third guard ring layer 303. In the present embodiment, the second RESURF layer 312 is spaced apart from the second guard ring layer 302 and the third guard ring layer 303. However, the second RESURF layer 312 may contact or may be spaced apart from the third guard ring layer 303.

The third RESURF layer 313 is disposed between the third guard ring layer 303 and the EQPR layer 300. The third RESURF layer 313 is spaced apart from the third guard ring layer 303 and the EQPR layer 300. However, the third RESURF layer 313 may contact or may be spaced apart from the EQPR layer 300.

The first field plate 321 opposes each guard ring layer and each RESURF layer via an inter layer dielectric 40. The first field plate 321 is formed of metal such as tungsten (W), for example. The first field plate 321 is electrically connected to each guard ring layer. Further, each RESURF layer is present on a lower side of an outer end portion 321*a* of the first field plate 321.

The second field plate 322 is stacked on the first field plate 321 via the inter layer dielectric 40. The second field plate 322 is formed of metal such as aluminum (Al), for example.

The second field plate 322 is also electrically connected to each guard ring layer. Further, the second field plate 322 is longer than the first field plate 321. Therefore, an outer end portion 322*a* of the second field plate 322 is positioned on the side of the EQPR layer 300 as compared to the outer end portion 321*a* of the first field plate 321. Any one of the first RESURF layer 311 to the third RESURF layer 313 is present also on a lower side of the outer end portion 322*a* of the second field plate 322. Further, the second field plate 322 is thicker than the first field plate 321.

Note that in the present embodiment, each guard ring layer is provided with the first field plate 321 and the second field plate 322, but the number of layers of the field plates may differ in each guard ring layer.

The inter layer dielectric 40 is provided on the front face of the semiconductor substrate 10. The inter layer dielectric 40 is formed of a silicon dioxide film, for example. In the inter layer dielectric 40, the above-described first field plate 321 and second field plate 322 are provided.

Hereinafter, a method for manufacturing the above-described semiconductor device according to the first embodiment will be described with reference to FIG. 2A to FIG. 2L. Here, the step of manufacturing the termination region 30 will mainly be described.

Figure 2A:
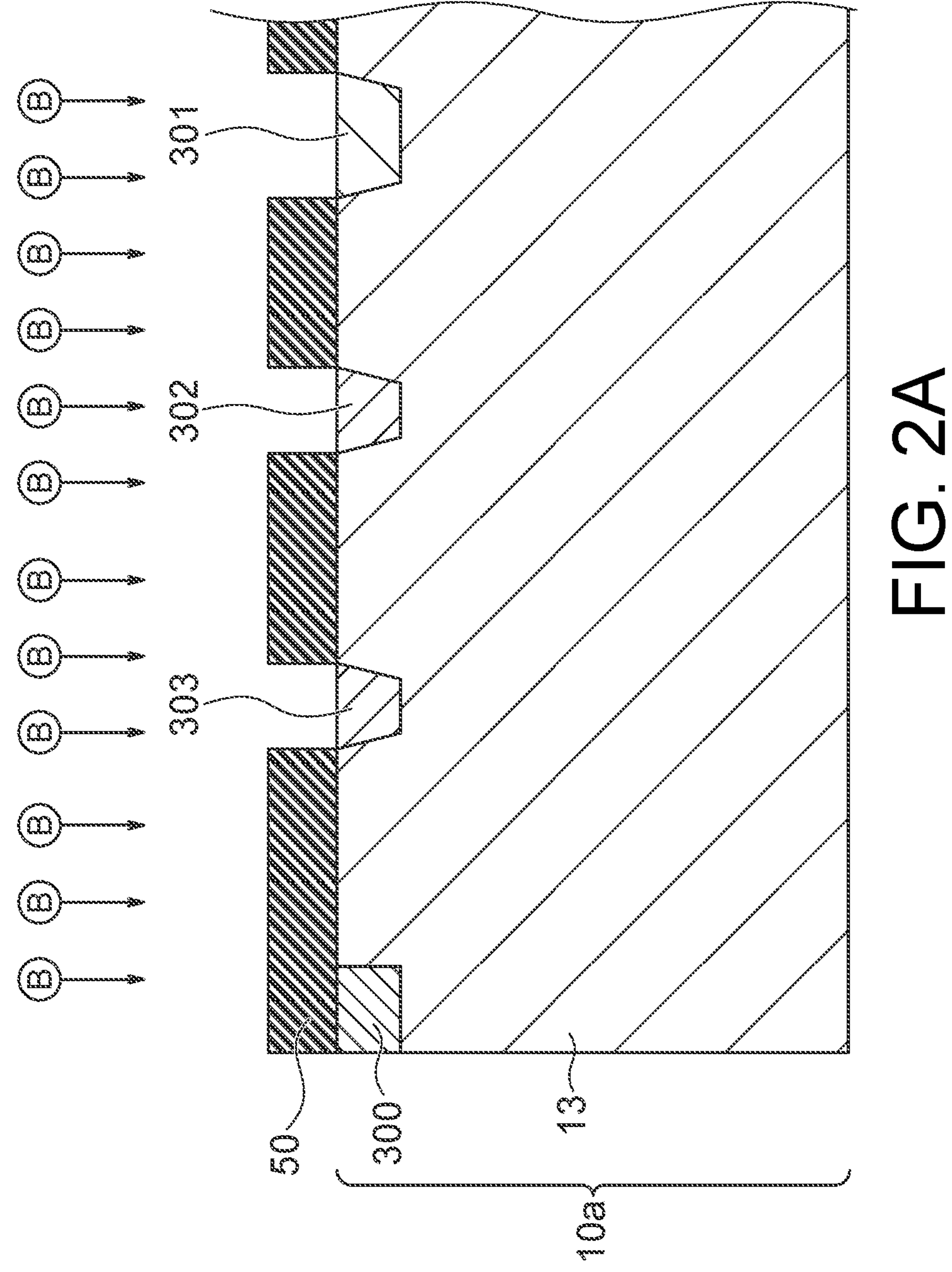
FIG. 2A is a cross-sectional view showing a step of forming a guard ring layer.

First, as shown in FIG. 2A, a resist 50 is formed on the front face of a semiconductor substrate 10*a* formed of the n-type base layer 13. The resist 50 is patterned so as to open portions where the first guard ring layer 301 to the third guard ring layer 303 are formed. Then, the resist 50 is irradiated with boron (B) ions from above. At this time, the boron ions passing through the openings of the resist 50 are injected into the front face of the semiconductor substrate 10*a*. Subsequently, the boron is diffused from the front face of the semiconductor substrate 10*a* by annealing. In this manner, the first guard ring layer 301 to the third guard ring layer 303 are formed. Thereafter, the resist 50 is removed.

Figure 2B:
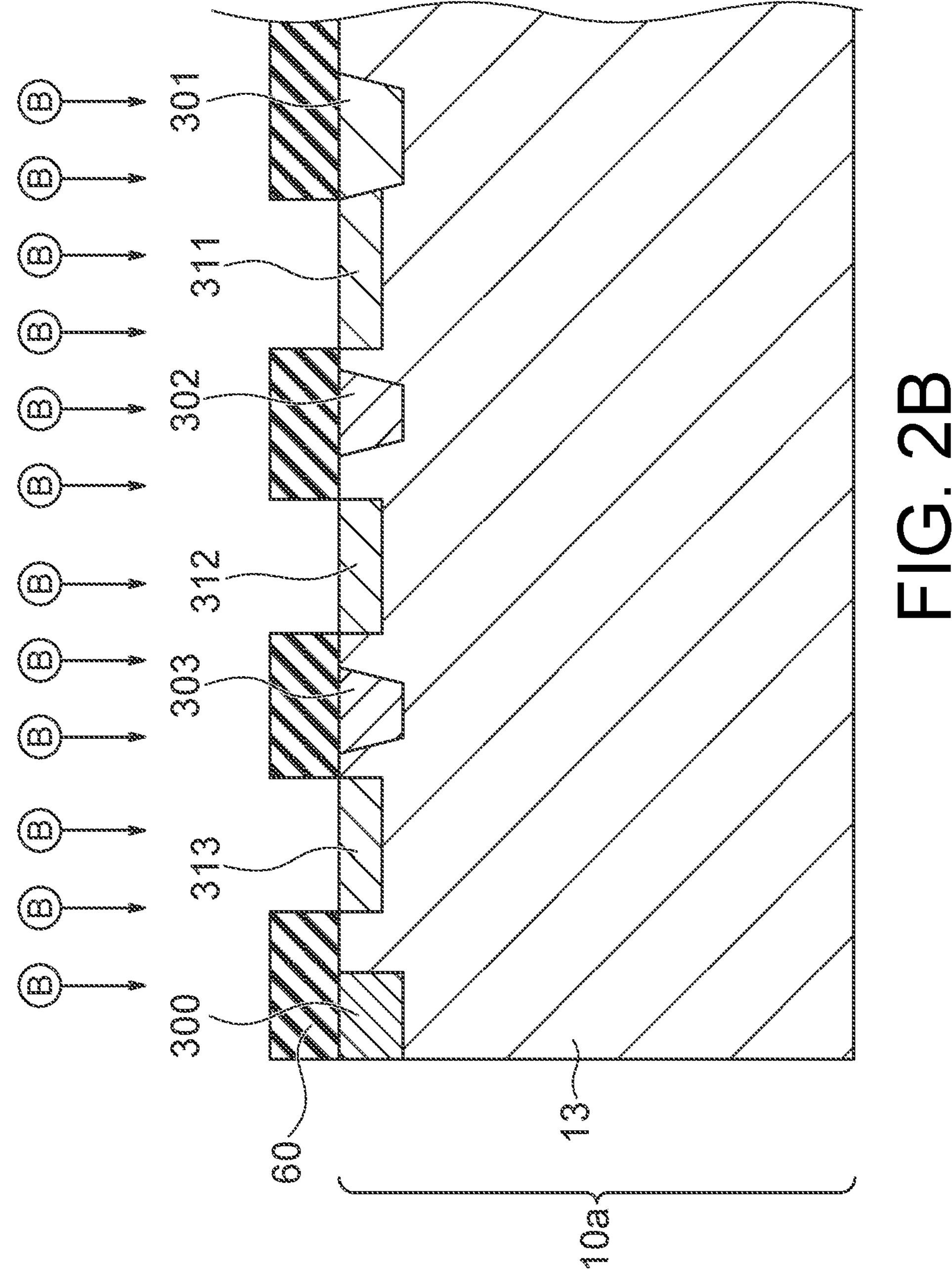
FIG. 2B is a cross-sectional view showing a step of forming a RESURF layer.

Next, as shown in FIG. 2B, a resist 60 is formed on the front face of the semiconductor substrate 10*a*. The resist 60 is patterned so as to open portions where the first RESURF layer 311 to the third RESURF layer 313 are formed. Then, the resist 60 is irradiated with boron (B) ions from above. At this time, the acceleration voltage of the boron ions is set lower than the acceleration voltage at the time of forming each guard ring layer. In this manner, each RESURF layer is formed in a position shallower than each guard ring layer from the front face of the semiconductor substrate 10*a*. Further, the concentration of the boron of each RESURF layer is lower than the concentration of the boron of each guard ring layer. Note that each RESURF layer can be formed in a position shallower than each guard ring layer also by thickening the resist 60 as compared to the resist 50.

The boron ions passing through the openings of the resist 60 are injected into the front face of the semiconductor substrate 10*a*. Subsequently, the boron is diffused from the front face of the semiconductor substrate 10*a* by annealing. In this manner, the first RESURF layer 311 to the third RESURF layer 313 are formed. Thereafter, the resist 60 is removed. Note that annealing of each guard ring layer and each RESURF layer may be performed at the time of forming the p-type base layer 21 of the cell region 20.

Next, the cell region 20 is formed. Here, the p-type base layer 21 and the n-type emitter layer 24 are formed by ion injection, for example. Further, a trench extending through the p-type base layer 21 and terminating in the n-type emitter layer 24 is formed by RIE (Reactive Ion Etching). The gate insulation film 23 and the gate electrode 22 are sequentially formed inside the trench by CVD (Chemical Vapor Deposition).

Figure 2C:
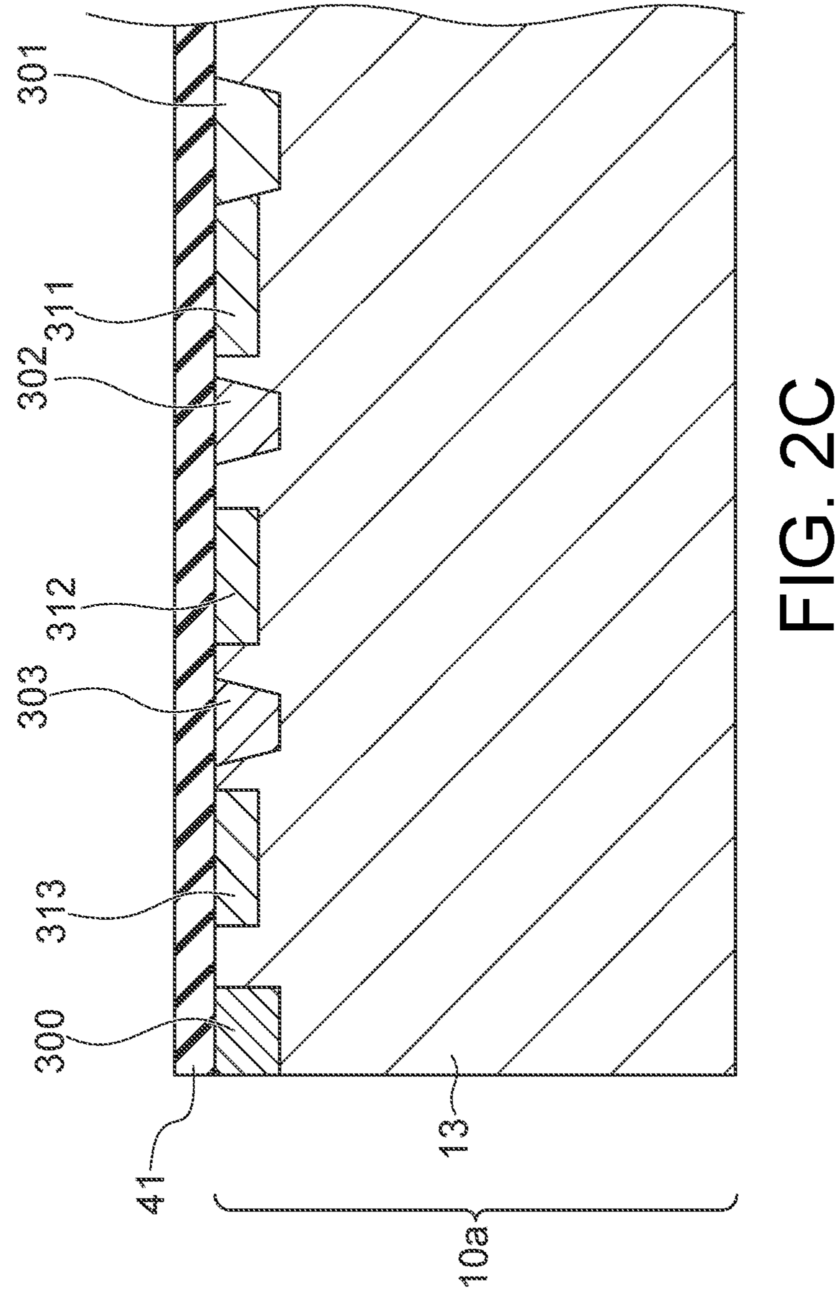
FIG. 2C is a cross-sectional view showing a step of forming a first inter layer dielectric.

Then, as shown in FIG. 2C, a first inter layer dielectric 41 is formed on the front face of the semiconductor substrate 10*a* where each guard ring layer and each RESURF layer are formed. The first inter layer dielectric 41 is a portion as a lower layer of the inter layer dielectric 40. The thickness of the first inter layer dielectric 41 is 1.1 μm, for example. The thickness of the first inter layer dielectric 41 corresponds to the distance between the first guard ring layer 301 and first RESURF layer 311, and the first field plate 321.

Figure 2D:
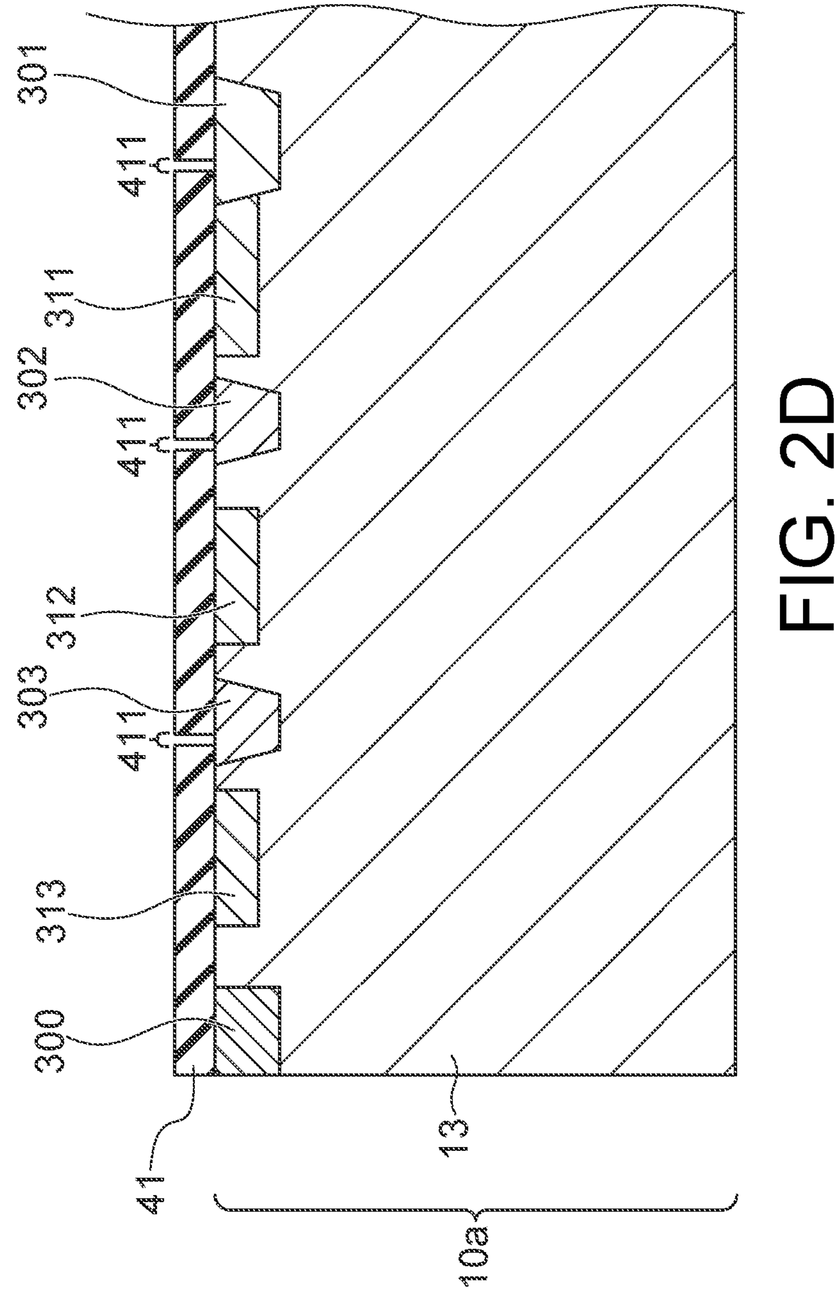
FIG. 2D is a cross-sectional view showing a step of forming a first opening.

Next, as shown in FIG. 2D, a first opening 411 extending through the first inter layer dielectric 41 is formed so as to expose a part of each guard ring layer. The first opening 411 is formed where the first field plate 321 is formed.

Figure 2E:
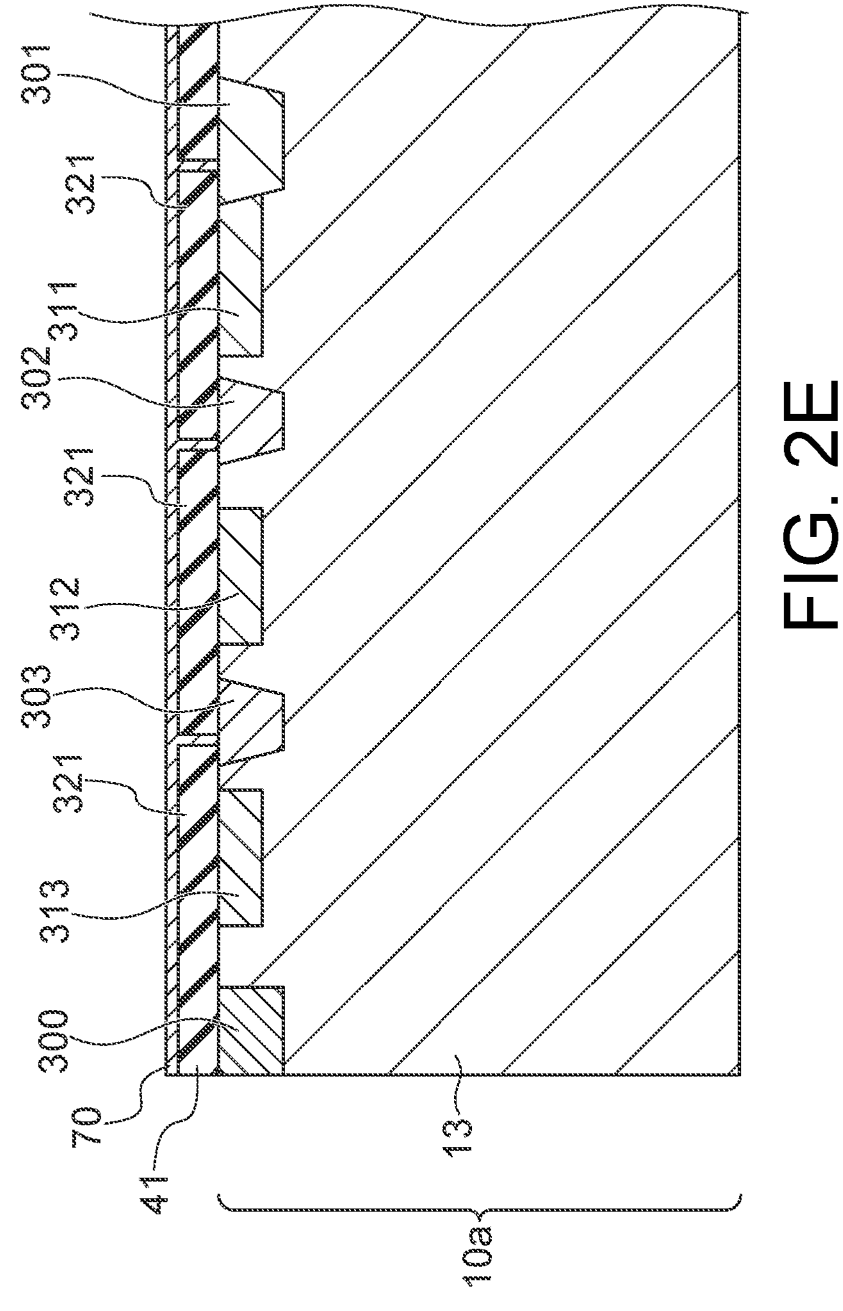
FIG. 2E is a cross-sectional view showing a step of forming a first conductive film.

Then, as shown in FIG. 2E, a first conductive film 70 is formed on the first inter layer dielectric 41. The first conductive film 70 is a tungsten film formed by CVD, for example. The film thickness of the first conductive film 70 is 300 nm, for example. In this step, the first opening 411 is filled with the first conductive film 70. The opening width of the first opening 411 is narrowed as much as possible, so that the surface of the first conductive film 70 can be made almost flat.

Figure 2F:
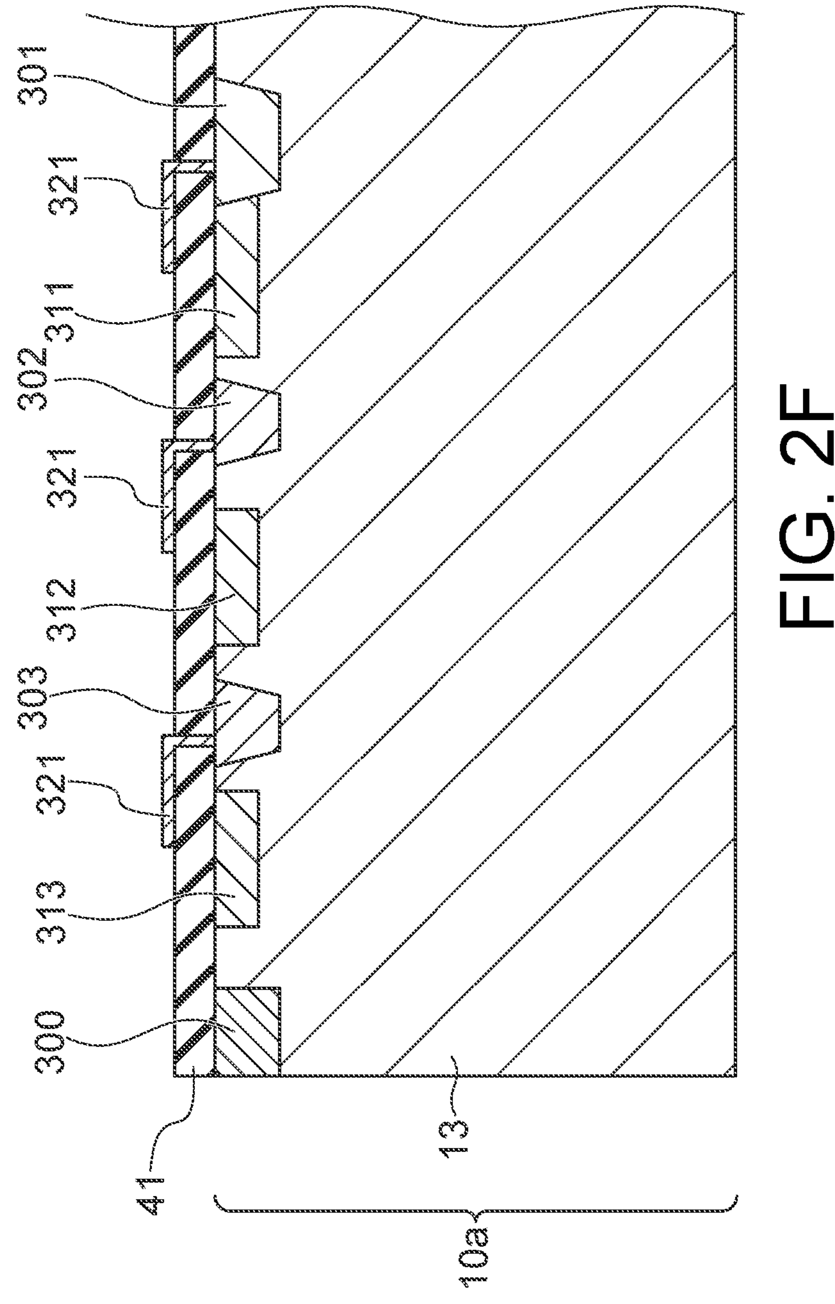
FIG. 2F is a cross-sectional view showing a step of removing a part of the first conductive film.

Then, as shown in FIG. 2F, an unnecessary portion of the first conductive film 70 is removed by RIE. In this manner, the first field plate 321 is completed. Further, the first conductive film 70 filled in the first opening 411 functions as a first contact plug that electrically connects the first field plate 321 to each guard ring layer.

Figure 2G:
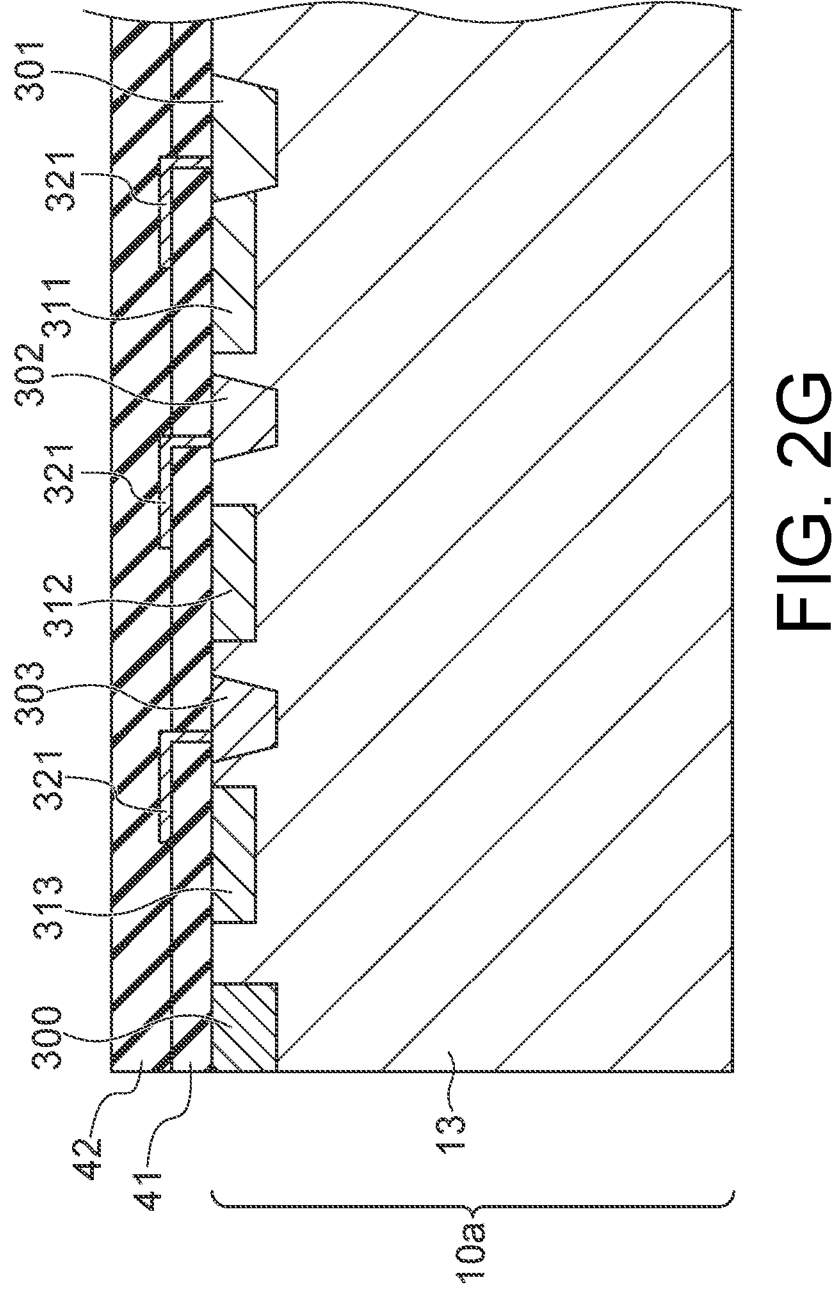
FIG. 2G is a cross-sectional view showing a step of forming a second inter layer dielectric.

Next, as shown in FIG. 2G, a second inter layer dielectric 42 is formed on the first inter layer dielectric 41 so as to cover the first field plate 321. The second inter layer dielectric 42 is a portion as an intermediate layer of the inter layer dielectric 40. The thickness of the second inter layer dielectric 42 only needs to be greater than the thickness of the first inter layer dielectric 41 and is 3 μm, for example. The thickness of the second inter layer dielectric 42 corresponds to the distance between the first field plate 321 and the second field plate 322.

Figure 2H:
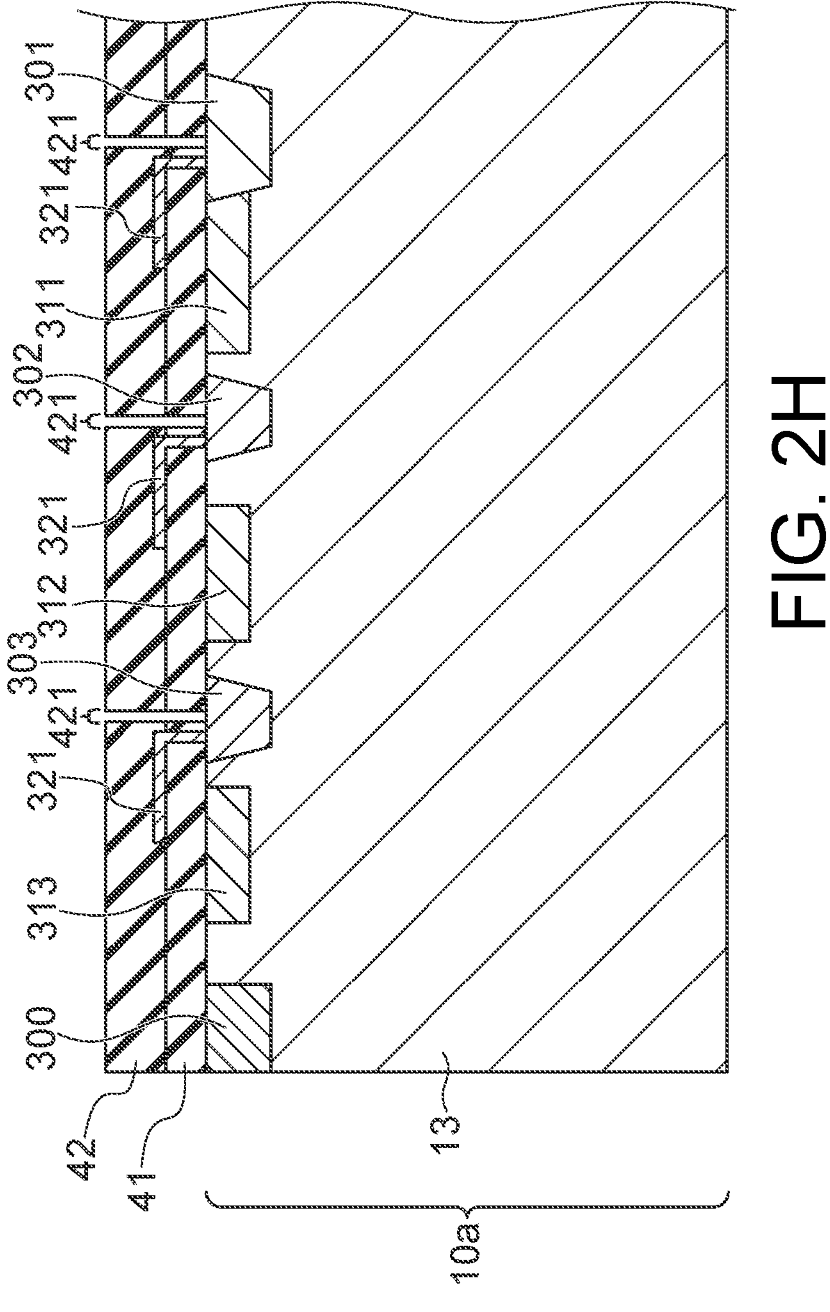
FIG. 2H is a cross-sectional view showing a step of forming a second opening.

Subsequently, as shown in FIG. 2H, a second opening 421 extending through the first inter layer dielectric 41 and the second inter layer dielectric 42 is formed so as to expose a part of each guard ring layer. The second opening 421 is formed in a portion where the second field plate 322 is formed. Note that the second opening 421 may be formed in the portion where the first field plate 321 is formed so as to extend through the second inter layer dielectric 42 such that a part of the first field plate 321 is exposed.

Figure 2I:
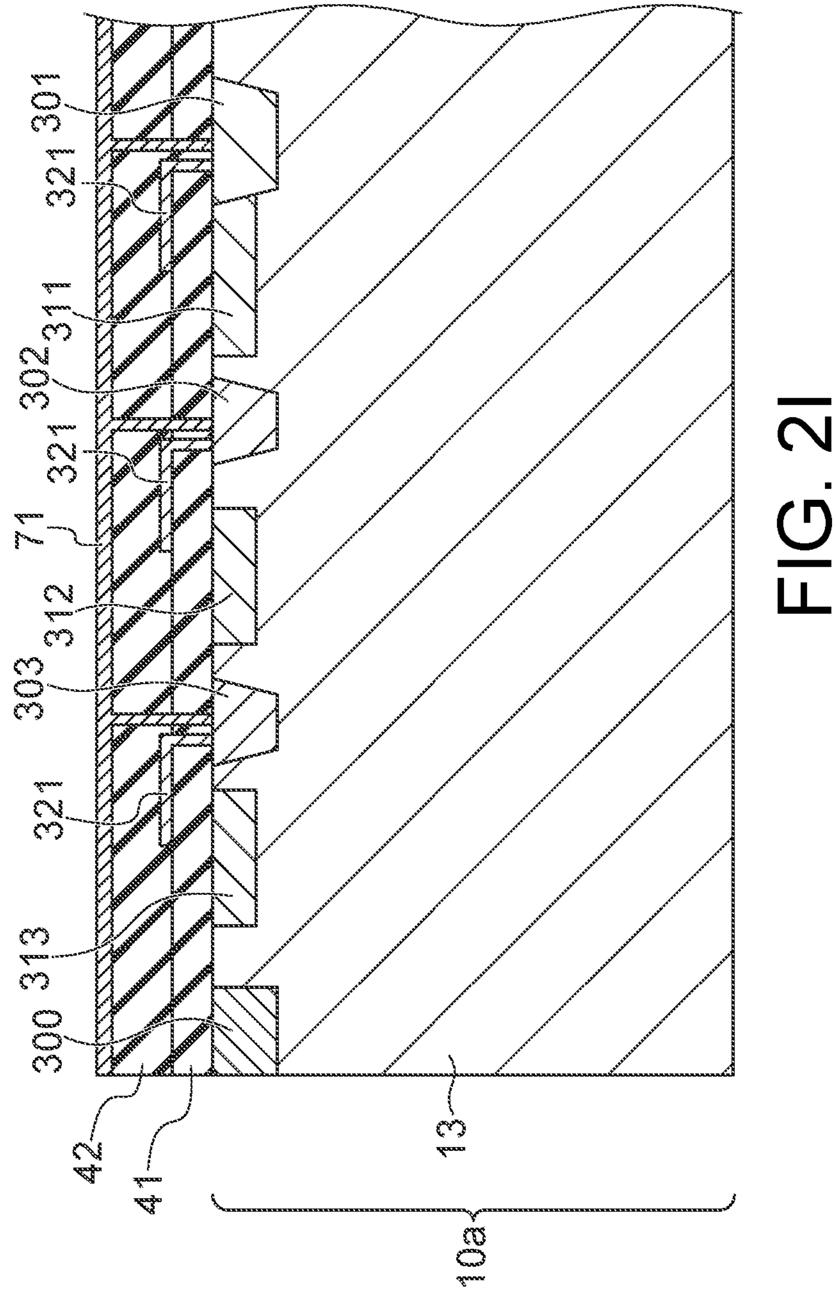
FIG. 2I is a cross-sectional view showing a step of forming a second conductive film.

Next, as shown in FIG. 2I, a second conductive film 71 is formed on the second inter layer dielectric 42. The second conductive film 71 is an aluminum film formed by PVD (Physical Vapor Deposition), for example. The film thickness of the second conductive film 71 is 4 μm, for example. In this step, the second opening 421 is filled with the second conductive film 71.

Figure 2J:
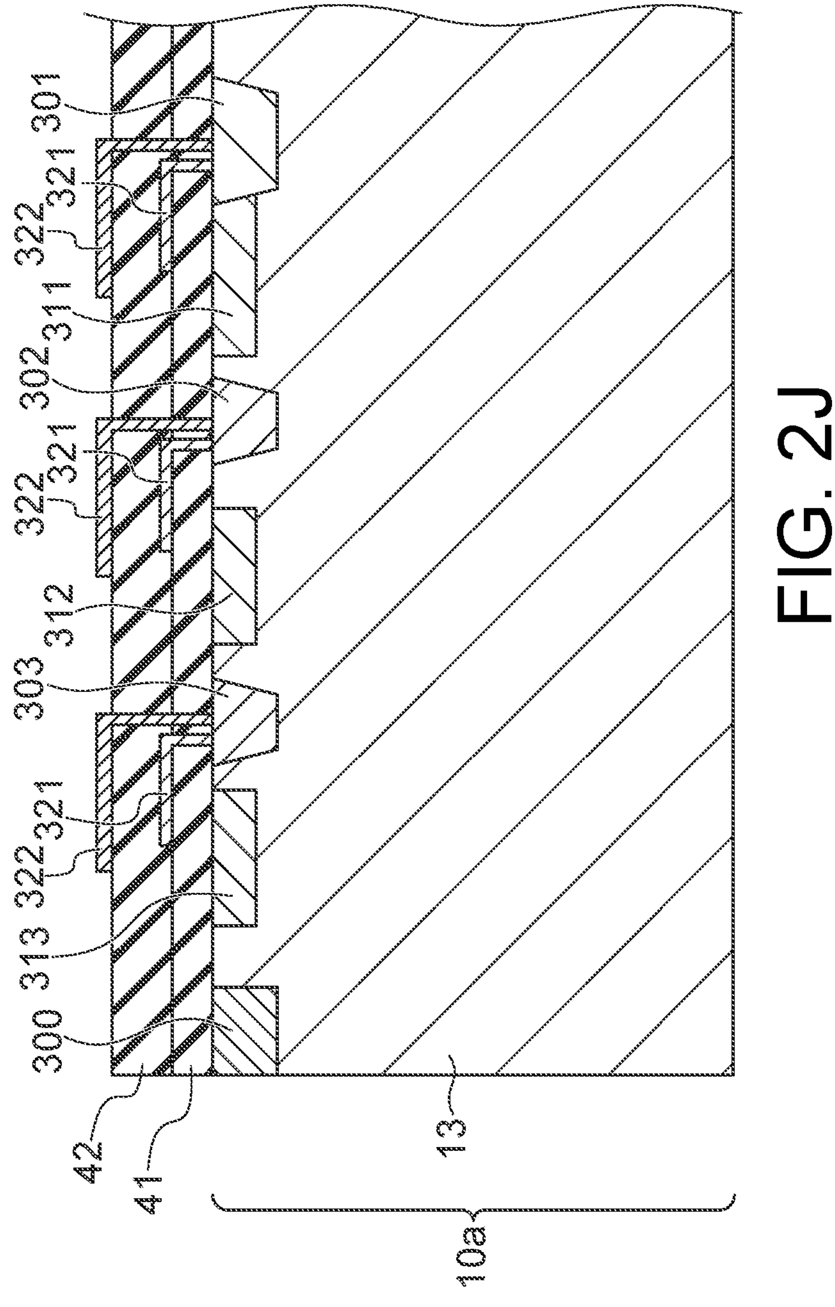
FIG. 2J is a cross-sectional view showing a step of removing a part of the second conductive film.

Then, as shown in FIG. 2J, an unnecessary portion of the second conductive film 71 is removed by RIE. In this manner, the second field plate 322 is completed. Further, the second conductive film 71 filled in the second opening 421 functions as a second contact plug that electrically connects the second field plate 322 to each guard ring layer.

Figure 2K:
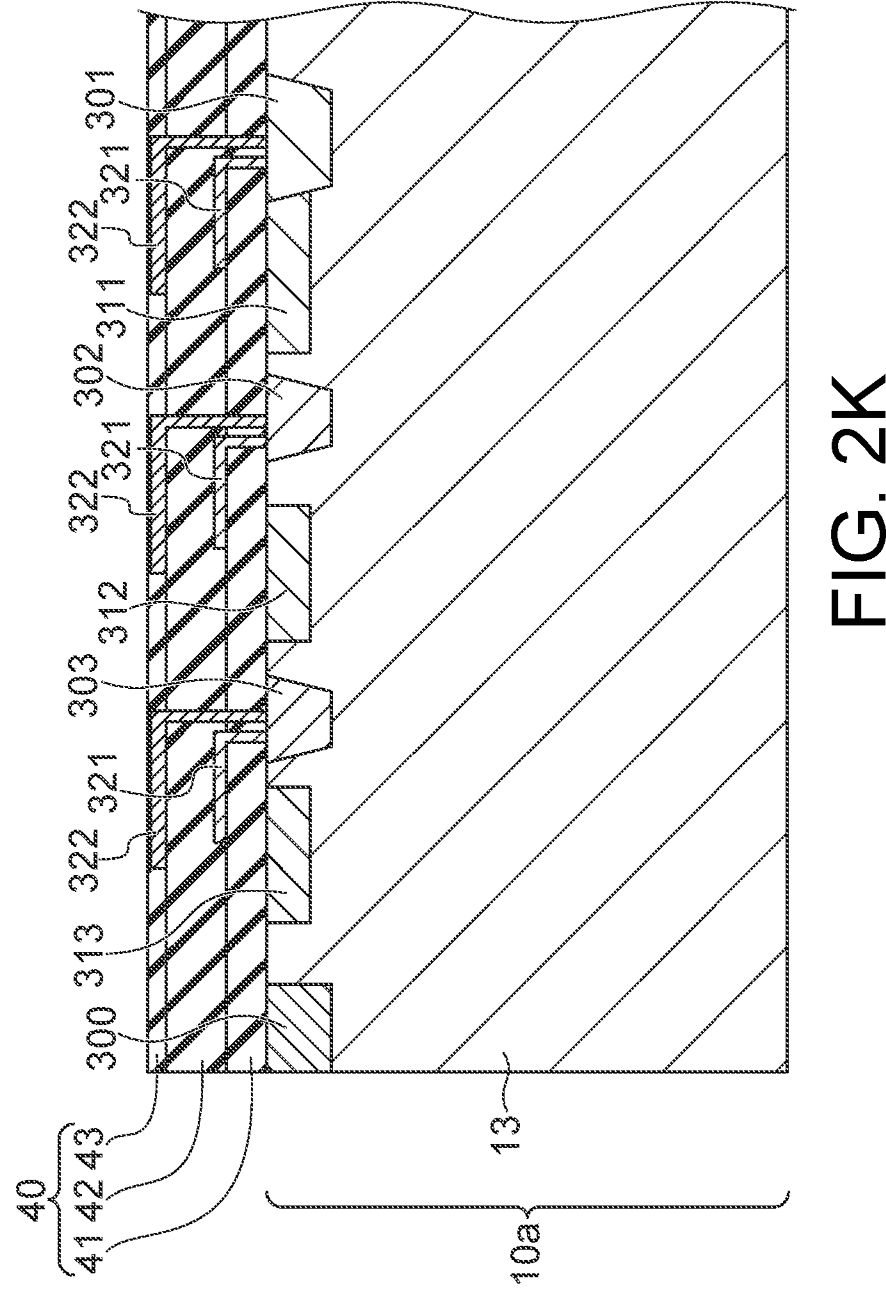
FIG. 2K is a cross-sectional view showing a step of forming a passivation film.
Figure 2L:
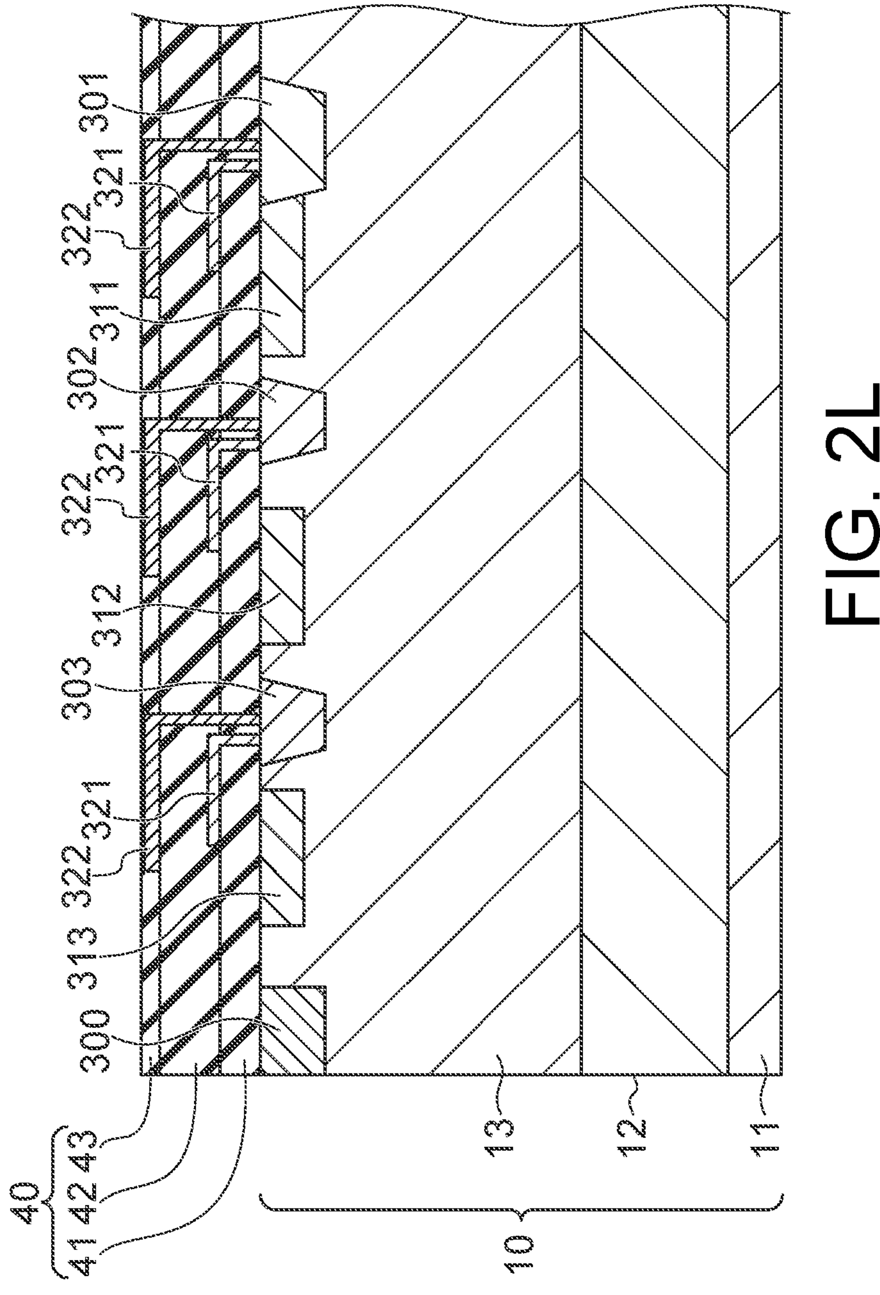
FIG. 2L is a cross-sectional view showing a step of forming an n-type buffer layer and a p-type collector layer.

Next, as shown in FIG. 2K, a passivation film 43 is formed on the second inter layer dielectric 42 so as to cover the second field plate 322. The passivation film 43 is a portion as an upper layer of the inter layer dielectric 40.

Finally, the n-type buffer layer 12 and the p-type collector layer 11 are sequentially formed on the entire back face of the semiconductor substrate 10*a*. The n-type buffer layer 12 can be formed, for example, by annealing with phosphorus (P) ions injected into the back face side of the semiconductor substrate 10*a*. Meanwhile, the p-type collector layer 11 can be formed by annealing with boron ions injected into the back face side of the semiconductor substrate 10*a*. Note that the p-type collector layer 11 may not be formed in the termination region 30. Further, the n-type buffer layer 12 may not be formed in either the cell region 20 or the termination region 30.

Here, a semiconductor device according to a comparative example that is compared with the above-described semiconductor device 1 according to the first embodiment will be described.

Figure 3:
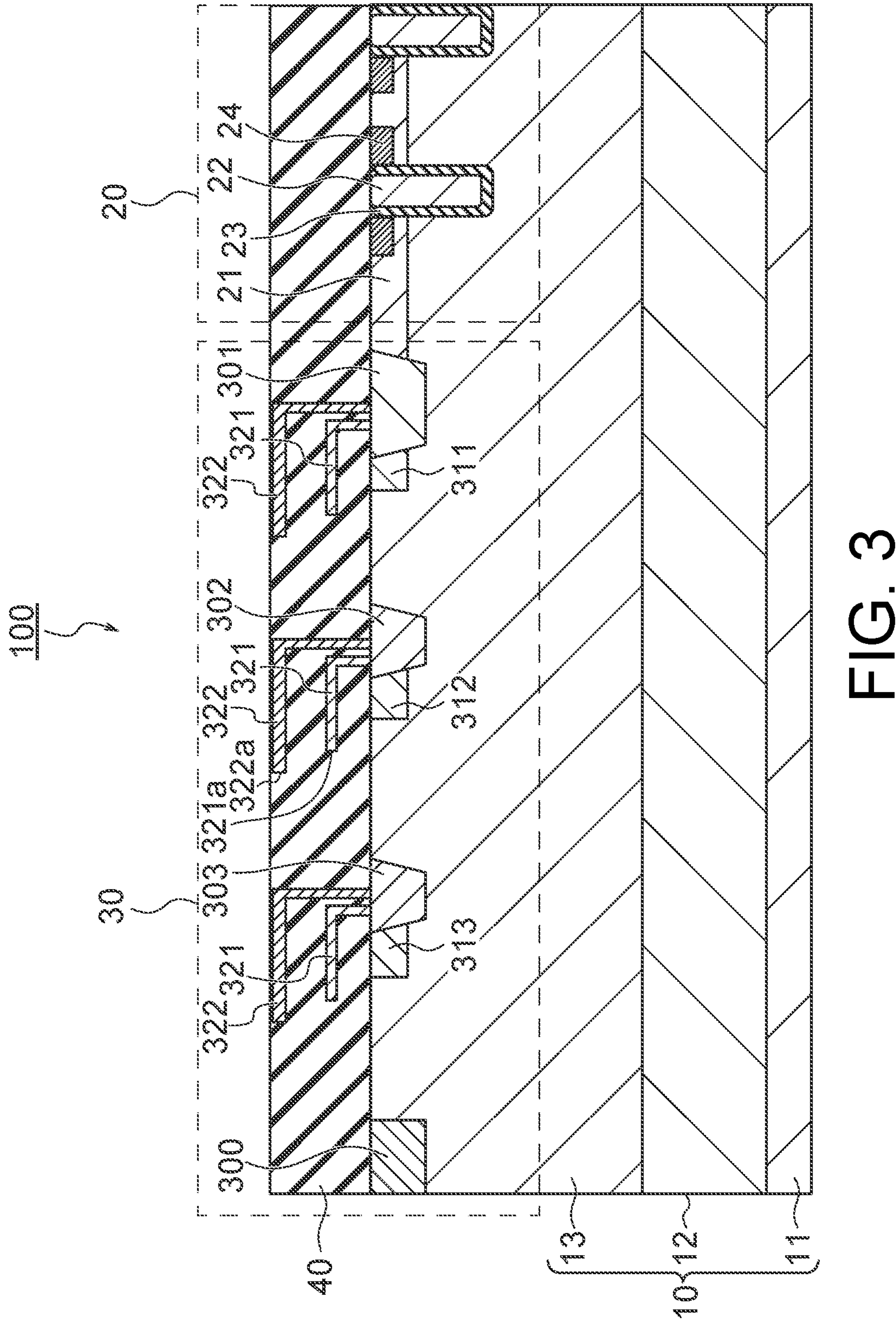
FIG. 3 is a cross-sectional view showing the structure of a semiconductor device according to a comparative example.

FIG. 3 is a cross-sectional view showing the structure of a semiconductor device according to a comparative example. In the present comparative example, the same constituent elements as those of the semiconductor device 1 according to the first embodiment are assigned the same reference numerals and the detailed descriptions will be omitted.

Similarly to the termination region 30 of the above-described semiconductor device 1, the termination region 30 of a semiconductor device 100 according to the present comparative example is also provided with the first guard ring layer 301 to the third guard ring layer 303, the first RESURF layer 311 to the third RESURF layer 313, the first field plate 321, and the second field plate 322.

However, in the semiconductor device 100, the first RESURF layer 311 to the third RESURF layer 313 contact their respective first guard ring layer 301 to the third guard ring layer 303. Further, each RESURF layer is not present on the lower side of the outer end portion of each field plate. In the termination structure including a plurality of guard ring layers and a plurality of field plate layers, as in the semiconductor device 100, each field plate is made longer to thus disperse the electric field exerted on each guard ring layer so that a high breakdown voltage is exhibited. However, since the termination region 30 does not contribute to the function of the semiconductor device 100, shortening of the termination region is highly required, and the length of each field plate is preferably shorter. Meanwhile, by making each field plate shorter, the electric field on the front face of the semiconductor substrate 10 increases to thus be more likely to be susceptible to the external charge. Therefore, it is important to be less susceptible to the external charge and to be highly robust against charge.

Further, as each field plate is made shorter, the first guard ring layer 301 (p-type diffusion region) contacting the cell region 20 (active region) is more likely to become a breakdown point. In general, when a breakdown occurs in the first guard ring layer 301 disposed near the cell region 20, the breakover voltage could decrease.

Meanwhile, in the above-described semiconductor device 1 according to the present embodiment, any one of the first RESURF layer 311 to the third RESURF layer 313 is present on the lower side of the outer end portion where each field plate terminates. Each RESURF layer does not contact each field plate and further, the second RESURF layer 312 and the third RESURF layer 313 do not contact each guard ring layer, either. That is, the second RESURF layer 312 and the third RESURF layer 313 are not present across the entire lower side of each field plate, but are present at least below the outer end portion. The semiconductor device 1 according to the present embodiment has such a termination structure so that the high electric field generating on the front face of the semiconductor substrate 10 can be mitigated. Thus, it is possible to improve the robustness against charge.

Further, in the present embodiment, the first guard ring layer 301 disposed closest to the cell region 20 contacts the first RESURF layer 311. Therefore, the electric field in a corner portion of the first guard ring layer 301 can be mitigated. In this manner, since the first guard ring layer 301 does not become a breakdown point, the deterioration of the breakover voltage can be suppressed.

Figure 4:
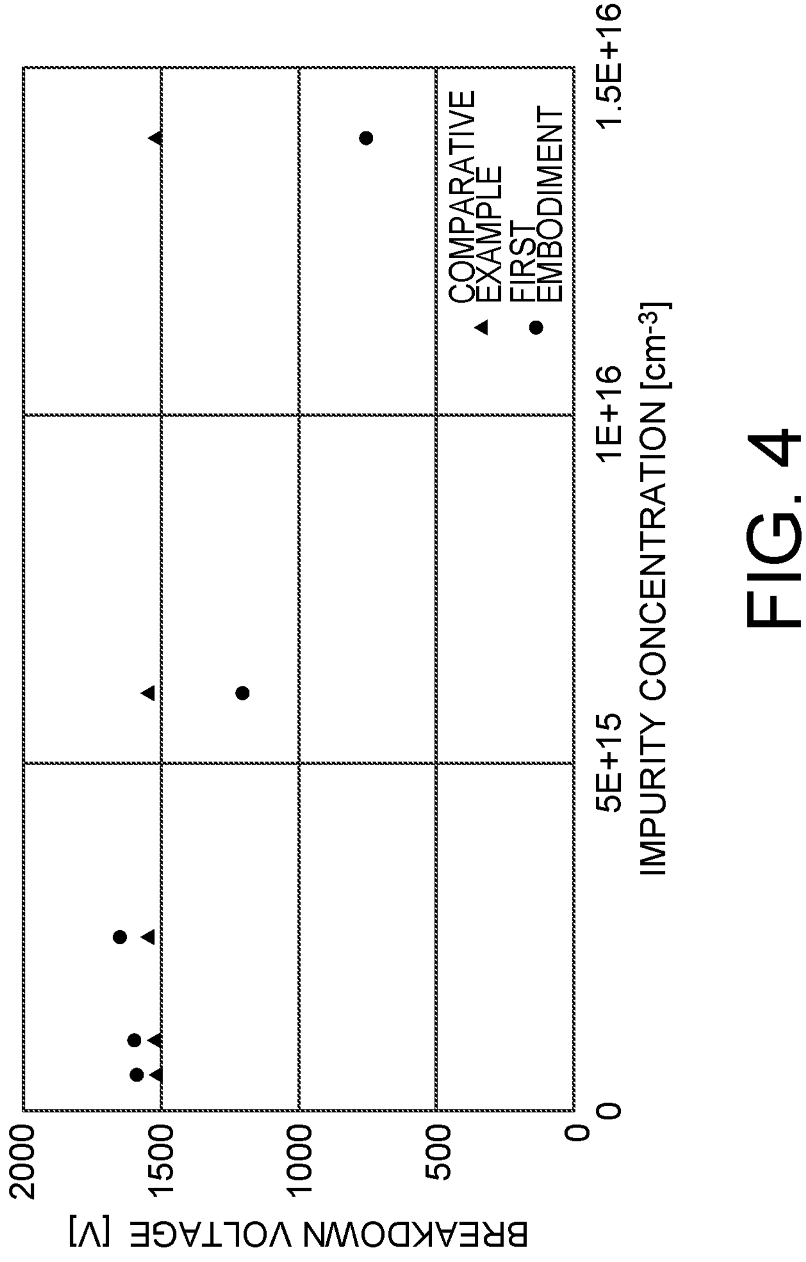
FIG. 4 is a graph showing an example of simulation results of the breakdown voltage.

FIG. 4 is a graph showing an example of simulation results of the breakdown voltage of the present embodiment and the comparative example. In FIG. 4, the lateral axis represents the concentration of the p-type impurity of each RESURF layer. The longitudinal axis represents the breakdown voltage between the collector and the emitter. Note that the concentration of the p-type impurity of each guard ring layer is the same between the present embodiment and the comparative example.

According to the simulation results shown in FIG. 4, in the termination structure of the comparative example, the breakdown voltage is almost unchanged irrespective of the concentration of the p-type impurity of the RESURF layer. Meanwhile, in the termination structure of the present embodiment, the breakdown voltage changes in accordance with the concentration of the p-type impurity of the RESURF layer. When the concentration of the p-type impurity is low, the breakdown voltage equivalent to that of the comparative example is exhibited, but when the concentration of the p-type impurity is high, the breakdown voltage decreases. This is because when the concentration of the p-type impurity is high, depletion does not easily occur to thus reduce the degree of bearing the electric field.

In the termination structure of the present embodiment, a region where the RESURF layer is formed is larger than that of the comparative example. Thus, the breakdown voltage can be maintained by reducing the concentration of the p-type impurity of the RESURF layer to facilitate the depletion. In the example shown in FIG. 4, the concentration of the p-type impurity is set equal to or less than $2.5\times10^{15}$ $cm^{-3}$ so that a high breakdown voltage can be maintained.

Figure 5:
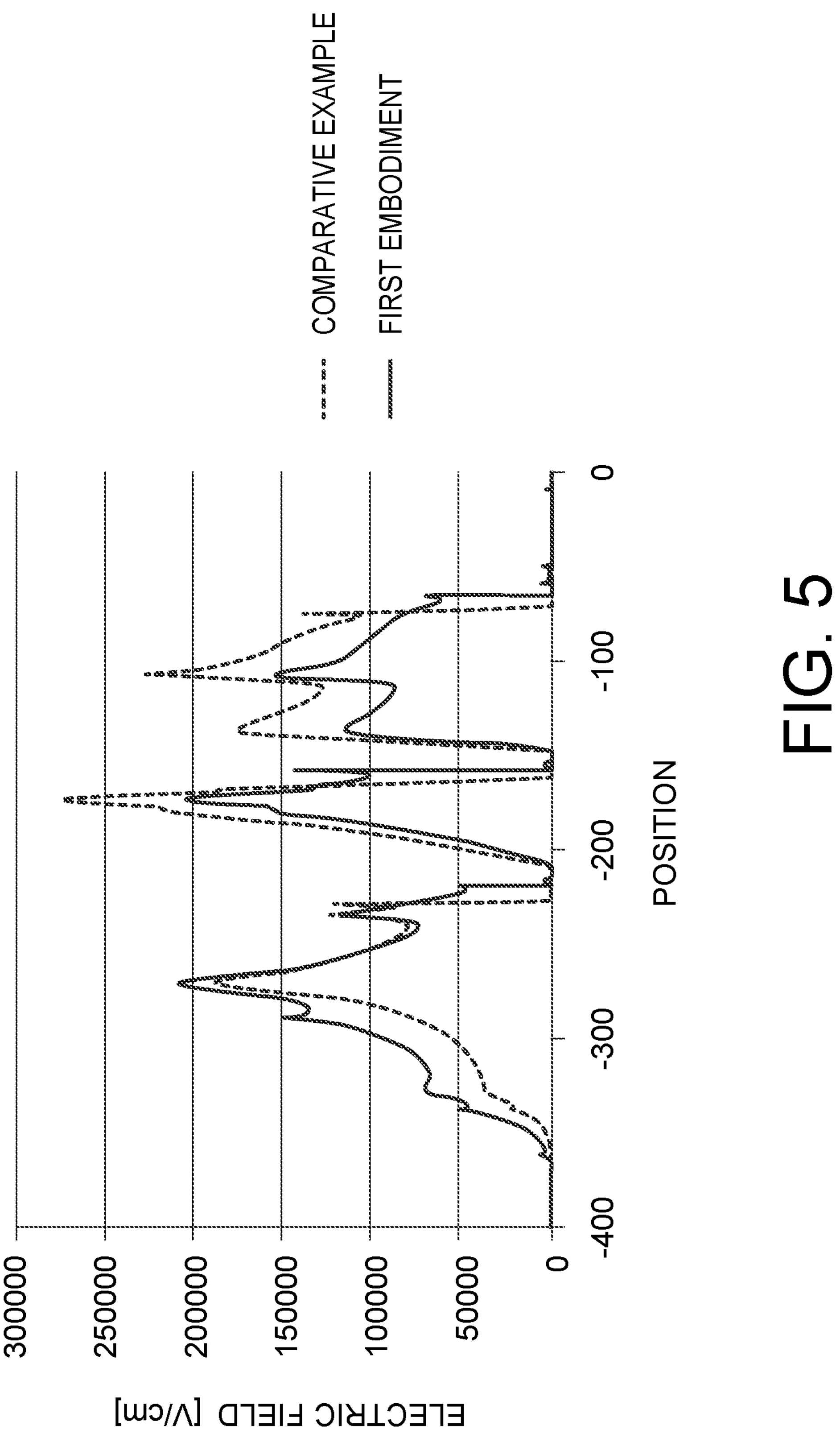
FIG. 5 is a graph showing an example of simulation results of the electric field distribution across the entire termination region.

FIG. 5 is a graph showing an example of simulation results of the electric field distribution across the entire termination region 30 of the present embodiment and the comparative example. In FIG. 5, the lateral axis represents the position of the termination region 30 in the lateral direction when the boundary between the cell region 20 and the termination region 30 is set as a reference. The longitudinal axis represents the electric field on the front face of the semiconductor substrate 10 in the termination region 30.

According to the simulation results shown in FIG. 5, the termination structure of the present embodiment can reduce not only the peak value of the electric field, but also the electric field across the entire termination region 30 as compared to the termination structure of the comparative example.

Figure 6:
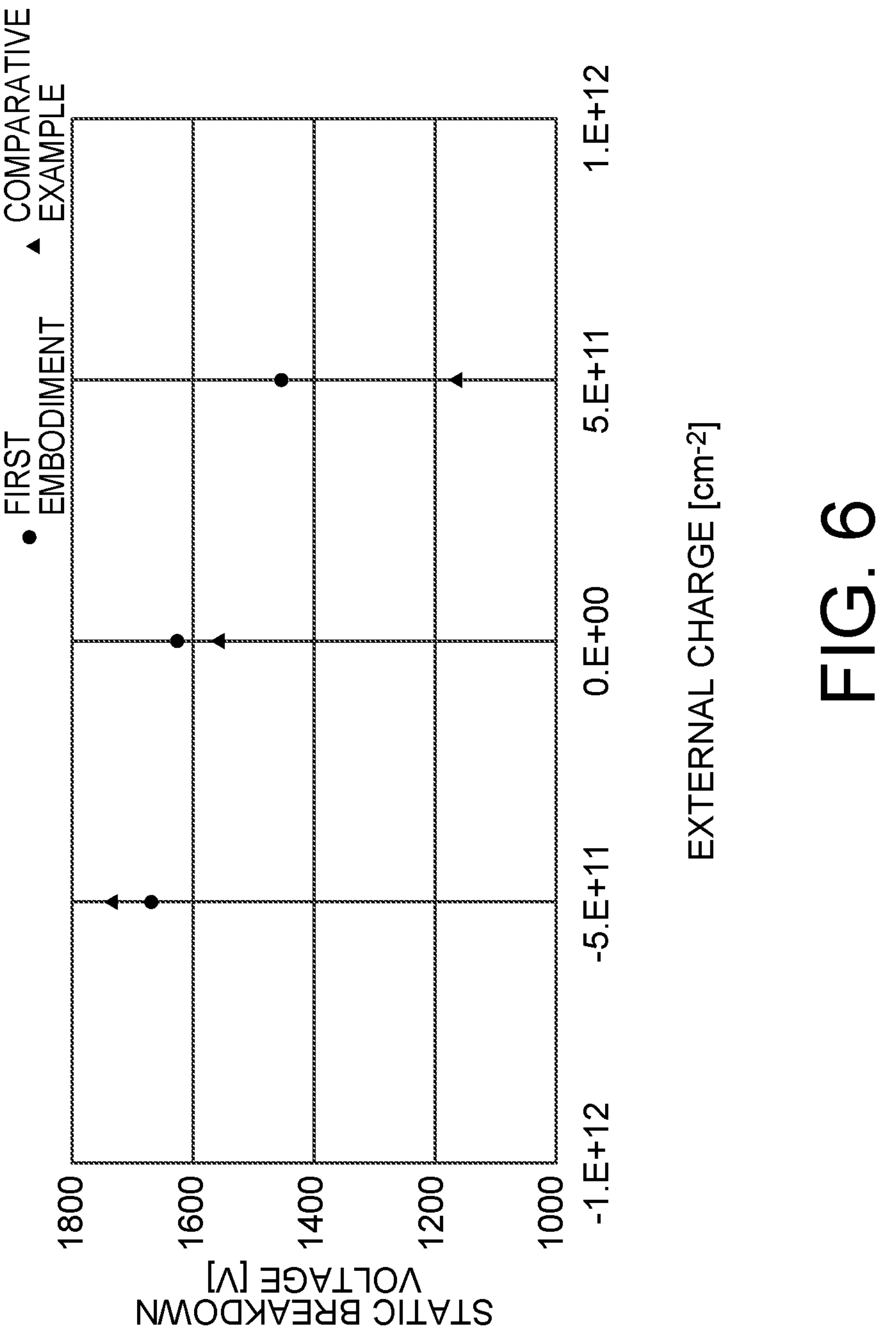
FIG. 6 is a graph showing an example of simulation results of robustness against charge of the termination region.

FIG. 6 is a graph showing an example of simulation results of robustness against charge of the termination region 30 of the present embodiment and the comparative example. In FIG. 6, the lateral axis represents the scale of the external charge accumulated in the termination region 30. The longitudinal axis represents the breakdown voltage of the termination region 30.

According to the simulation results shown in FIG. 6, when a positive charge is accumulated, in the termination structure of the comparative example, the breakdown voltage significantly decreases, while in the termination structure of the present embodiment, the fluctuation in the breakdown voltage is reduced.

Figure 7:
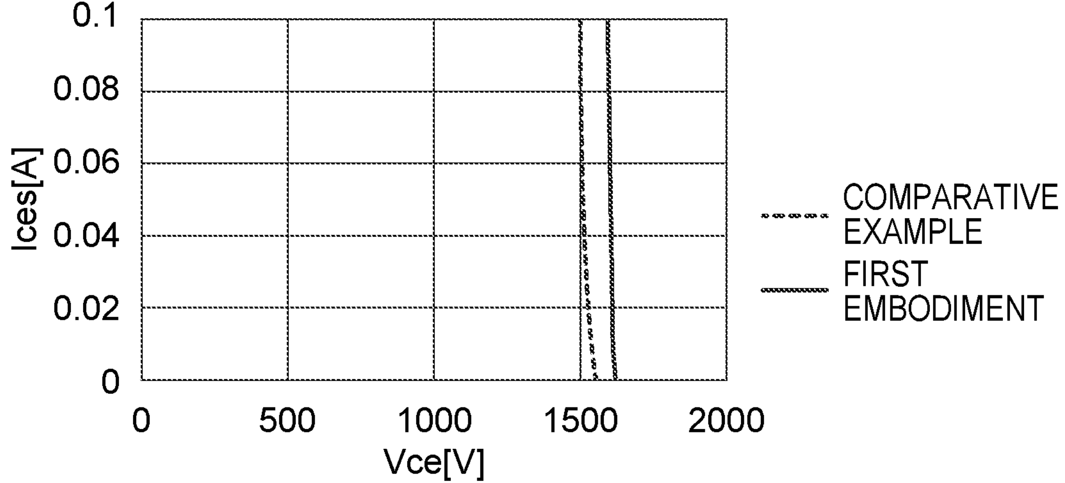
FIG. 7 is a graph showing an example of simulation results of the breakover voltage.

FIG. 7 is a graph showing an example of simulation results of the breakover voltage of the present embodiment and the comparative example. In FIG. 7, the lateral axis represents the breakdown voltage Vces between the collector and the emitter. The longitudinal axis represents the leakage current Ices between the collector and the emitter.

According to the simulation results shown in FIG. 7, the rising waveform of the electric current is in an almost equivalent form between the comparative example and the present embodiment, and the deterioration of the breakover voltage can be suppressed.

According to the present embodiment described above, the first guard ring layer 301 and the first RESURF layer 311 contact with each other, while the second guard ring layer 302 and the third guard ring layer 303 are spaced apart from each RESURF layer. In this manner, the electric field of the first guard ring layer 301 decreases, while the electric field of the second guard ring layer 302 and the third guard ring layer 303 does not decrease, and thus, the first guard ring layer 301 does not become a breakdown point. In this manner, the deterioration of the breakover voltage can be avoided.

Further, each RESURF layer is formed on the lower side of the outer end portion of each field plate. In this manner, each RESURF layer mitigates the electric field near the front face of the semiconductor substrate 10, and thus, the robustness against charge can be improved.

Second Embodiment

Figure 8:
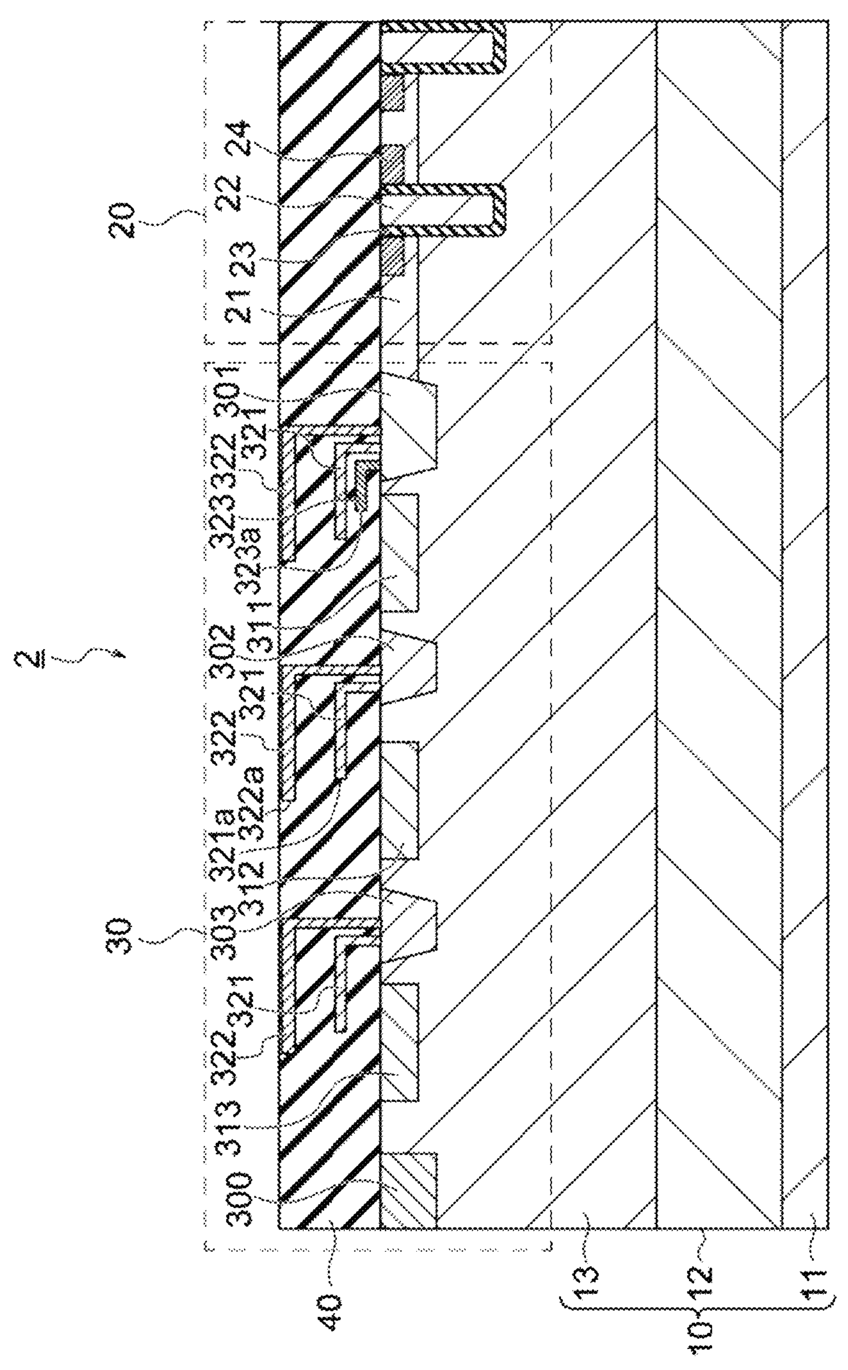
FIG. 8 is a cross-sectional view showing the schematic structure of a semiconductor device according to a second embodiment.

FIG. 8 is a cross-sectional view showing the schematic structure of a semiconductor device according to a second embodiment. In FIG. 8, the same constituent elements as those of the above-described semiconductor device 1 according to the first embodiment are assigned the same reference numerals and the detailed descriptions will be omitted.

A semiconductor device 2 according to the present embodiment differs from the semiconductor device 1 according to the first embodiment in that the first RESURF layer 311 is spaced apart from the first guard ring layer 301. However, the corner portion of the first guard ring layer 301 is connected to the p-type base layer 21 of the cell region 20, and is thus a site where the electric field is likely to become the highest. Therefore, some means to mitigate the electric field is required.

Thus, in the present embodiment, instead of spacing the first guard ring layer 301 apart from the first RESURF layer 311, a third field plate 323 is added on the first guard ring layer 301 via the inter layer dielectric 40. The third field plate 323 can be formed on a thin inter layer dielectric formed on the first guard ring layer 301. The thickness of the inter layer dielectric corresponds to the distance between the first guard ring layer 301 and the first RESURF layer 311, and the third field plate 323 and is 600 nm, for example.

The third field plate 323 is, for example, a metal film of tungsten or the like or a polysilicon film. Further, the third field plate 323 is positioned on a lower layer of the first field plate 321 and is shorter than the first field plate 321. Furthermore, the first field plate 321 is present on a lower side of an outer end portion **323*a* of the third field plate 323**.

According to the present embodiment including the termination structure as described above, even when the first RESURF layer 311 is spaced apart from the first guard ring layer 301, the third field plate 323 mitigates the electric field in the corner portion of the first guard ring layer 301. Consequently, similarly to the first embodiment, the first guard ring layer 301 does not become a breakdown point. Thus, the deterioration of the breakover voltage can be avoided.

Further, the first RESURF layer 311 is formed on the lower side of the outer end portion **323*a* of the third field plate 323. In this manner, since the first RESURF layer 311 mitigates the electric field near the front face of the semiconductor substrate 10** similarly to the first embodiment, the robustness against charge can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
- a semiconductor substrate;
- a cell region on a side of a front face of the semiconductor substrate; and
- a termination region on an outer side of the cell region on the side of the front face of the semiconductor substrate, wherein
- the termination region surrounds the cell region and includes:
  - a plurality of first diffusion layers containing a first conductive impurity, the first diffusion layers including a first layer closest to the cell region, a second layer second closest to the cell region, and a third layer third closest to the cell region;
  - a plurality of second diffusion layers each disposed on an outer side of each of the plurality of first diffusion layers and having a concentration of the first conductive impurity that is lower than that of the first diffusion layers, one of the second diffusion layers being disposed between the second layer and the third layer and being spaced apart from the second layer; and
  - a plurality of conductive layers opposing the first diffusion layers and the second diffusion layers on the front face of the semiconductor substrate, the plurality of conductive layers electrically connected to the first diffusion layers, the plurality of conductive layers each having an outer end portion, and
- on a lower side of the outer end portion, any one of the plurality of second diffusion layers is present.

2. The semiconductor device according to claim 1, wherein the plurality of conductive layers is stacked via an insulation film.

3. The semiconductor device according to claim 2, wherein
- the plurality of conductive layers comprises:

a first conductive layer opposing each of the first diffusion layers and each of the second diffusion layers via the insulation film; and a second conductive layer stacked on the first conductive layer via the insulation film, the second conductive layer being longer than the first conductive layer, and on a lower side of an outer end portion of the first conductive layer and of an outer end portion of the second conductive layer, any one of the plurality of second diffusion layers is present.

4. The semiconductor device according to claim 3, wherein the first conductive layer includes tungsten (W), and the second conductive layer includes aluminum (Al).

5. The semiconductor device according to claim 3, wherein the first layer contacts one of the second diffusion layers that is disposed between the first layer and the second layer.

6. The semiconductor device according to claim 3, comprising a third conductive layer that is electrically connected to the first layer, the third conductive layer stacked below the first conductive layer via the insulation film, the third conductive layer being shorter than the first conductive layer, wherein on a lower side of an outer end portion of the third conductive layer, a second diffusion layer of the plurality of second diffusion layers that is disposed on an outer side of the first layer is present.

7. The semiconductor device according to claim 6, wherein the first conductive layer includes tungsten (W), the second conductive layer includes aluminum (Al), and the third conductive layer includes tungsten or polysilicon.

8. The semiconductor device according to claim 6, wherein the first layer is spaced apart from one of the second diffusion layers that is disposed between the first layer and the second layer.

9. The semiconductor device according to claim 1, wherein the cell region comprises:

a third diffusion layer contacting the first layer and having a concentration of the first conductive impurity that is lower than that of the first diffusion layers;

a gate electrode extending through the third diffusion layer from the front face of the semiconductor substrate;

a gate insulation film electrically insulating the gate electrode from the third diffusion layer; and a fourth diffusion layer opposing, via the gate insulation film, the gate electrode within the third diffusion layer and containing a second conductive impurity.

10. A manufacturing method for a semiconductor device, the semiconductor device including a semiconductor substrate, a cell region formed on a side of a front face of the semiconductor substrate, and a termination region formed on an outer side of the cell region on the side of the front face of the semiconductor substrate, the method comprising:

forming, in the termination region, a plurality of first diffusion layers containing a first conductive impurity so as to continuously surround the cell region, the first diffusion layers including a first layer closest to the cell region, a second layer second closest to the cell region, and a third layer third closest to the cell region;

forming, in the termination region, a plurality of second diffusion layers each on an outer side of each of the plurality of first diffusion layers, the plurality of second diffusion layers having a concentration of the impurity that is lower than a concentration of the impurity of the first diffusion layers, one of the second diffusion layers being disposed between the second layer and the third layer and being spaced apart from the second layer; and forming a plurality of conductive layers opposing the first diffusion layers and the second diffusion layers, via an insulation film, on the front face of the semiconductor substrate, the plurality of conductive layers electrically connected to the first diffusion layers, the plurality of conductive layers each having an outer end portion, wherein on a lower side of the outer end portion, any one of the plurality of second diffusion layers is present.

11. The manufacturing method according to claim 10, wherein the plurality of conductive layers is stacked via the insulation film.

12. The manufacturing method according to claim 11, comprising:

forming, in the plurality of conductive layers, a first conductive layer opposing each of the first diffusion layers and each of the second diffusion layers via the insulation film, and a second conductive layer stacked on the first conductive layer via the insulation film, the second conductive layer being longer than the first conductive layer; and forming any one of the plurality of second diffusion layers on a lower side of an outer end portion of the first conductive layer and of an outer end portion of the second conductive layer.

13. The manufacturing method according to claim 12, wherein the first conductive layer is formed using tungsten (W), and the second conductive layer is formed using aluminum (Al).

14. The manufacturing method according to claim 12, wherein the first layer is formed so as to contact one of the second diffusion layers that is disposed between the first layer and the second layer.

15. The manufacturing method according to claim 12, comprising:

forming a third conductive layer that is electrically connected to the first layer, the third conductive layer stacked below the first conductive layer via the insulation film, the third conductive layer being shorter than the first conductive layer; and forming, on a lower side of an outer end portion of the third conductive layer, a second diffusion layer of the plurality of second diffusion layers that is disposed on an outer side of the first layer.

16. The manufacturing method according to claim 15, wherein the first conductive layer is formed using tungsten (W), the second conductive layer is formed using aluminum (Al), and the third conductive layer is formed using tungsten or polysilicon.

17. The manufacturing method according to claim 15, wherein the first layer is formed so as to be spaced apart from one of the second diffusion layers that is disposed between the first layer and the second layer.

18. The manufacturing method according to claim 10, comprising forming, in the cell region a third diffusion layer contacting the first layer and having a concentration of the first conductive impurity that is lower than the concentration of the first conductive impurity of the first diffusion layers, a gate electrode extending through the third diffusion layer from the front face of the semiconductor substrate, a gate insulation film electrically insulating the gate electrode from the third diffusion layer, and a fourth diffusion layer opposing, via the gate insulation film, the gate electrode within the third diffusion layer and containing a second conductive impurity.

19. The semiconductor device according to claim 6, wherein the first conductive layer is positioned between the semiconductor substrate and the second conductive layer.

20. The semiconductor device according to claim 19, wherein the first conductive layer is positioned between the third conductive layer and the second conductive layer.

* * * * *